United States Patent
Kante et al.

(10) Patent No.: US 11,152,768 B2
(45) Date of Patent: Oct. 19, 2021

(54) SYSTEM AND METHOD FOR BOUND STATE IN CONTINUUM LASER SOURCES

(71) Applicant: The Regents of the University of California, Oakland, CA (US)

(72) Inventors: Boubacar Kante, La Jolla, CA (US); Yeshaiahu Fainman, San Diego, CA (US); Thomas Lepetit, San Diego, CA (US); Ashok Kodigala, La Jolla, CA (US); Qing Gu, San Diego, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/767,520

(22) PCT Filed: Oct. 7, 2016

(86) PCT No.: PCT/US2016/055960
§ 371 (c)(1),
(2) Date: Apr. 11, 2018

(87) PCT Pub. No.: WO2017/066095
PCT Pub. Date: Apr. 20, 2017

(65) Prior Publication Data
US 2018/0287348 A1 Oct. 4, 2018

Related U.S. Application Data

(60) Provisional application No. 62/240,867, filed on Oct. 13, 2015.

(51) Int. Cl.
*H01S 5/42* (2006.01)
*H01S 5/04* (2006.01)
(Continued)

(52) U.S. Cl.
CPC .............. *H01S 5/423* (2013.01); *H01S 5/041* (2013.01); *H01S 5/1042* (2013.01); *H01S 5/183* (2013.01);
(Continued)

(58) Field of Classification Search
CPC ........ H01S 5/423; H01S 5/183; H01S 5/1042; H01S 5/041; H01S 5/34313; H01S 2301/16
See application file for complete search history.

(56) References Cited

U.S. PATENT DOCUMENTS 6,711,200 B1 * 3/2004 Scherer ................. H01S 3/0635
372/64
7,206,488 B1 * 4/2007 Altug ................... G02B 6/1225
385/131
(Continued)

OTHER PUBLICATIONS

Lepetit et al., "Resonantly Trapped Bound State in the Continuum Laser", Aug. 21, 2015; Retrieved from the Internet https://arxiv.org/ftp/antiv/papers/1508/1508.05164.pdf>. (Year: 2015).*
(Continued)

*Primary Examiner* — Xinning(Tom) Niu
(74) *Attorney, Agent, or Firm* — Stuart H. Mayer; Mayer & Williams PC

(57) ABSTRACT

Systems and methods according to present principles provide, at room temperature, a bound state in the continuum laser that harnesses optical modes residing in the radiation continuum but nonetheless may possess arbitrarily high quality factors. These counterintuitive cavities are based on resonantly trapped symmetry-compatible modes that destructively interfere. Such systems and methods may be applied towards coherent sources with intriguing topological properties for optical trapping, biological imaging, and quantum communication.

21 Claims, 17 Drawing Sheets

(51) Int. Cl.
  *H01S 5/10* (2021.01)
  *H01S 5/343* (2006.01)
  *H01S 5/183* (2006.01)
(52) U.S. Cl.
  CPC ...... *H01S 5/34313* (2013.01); *H01S 2301/16* (2013.01)

(56) References Cited

U.S. PATENT DOCUMENTS

| | | | |
|---|---|---|---|
| 7,615,389 B2 | 11/2009 | Bhat et al. | |
| 9,020,003 B1 | 4/2015 | McLaurin et al. | |
| 2006/0245464 A1* | 11/2006 | Hori | H01S 5/183 372/99 |

OTHER PUBLICATIONS

M. Meier et al., "Laser action from two-dimensional distributed feedback in photonic crystals", Appl. Phys. Lett. 74, 7-9 (1999) (Year : 1999).*

Hsu et al., "Bound states in the continuum." Nature Reviews Materials, 1, pp. 16048., Jul. 2016 (Year: 2016).*

Hsu, C., Zhen, B., Lee, J. et al. Observation of trapped light within the radiation continuum. Nature 499,188-191 (2013) (Year: 2013).*

Lepetit, Tel al. "Resonantly Trapped Bound State in the Continuum Laser", Aug. 21, 2015. [retrieved Jan. 20, 2017]; Retrieved from the Internet <URL: https://arxiv.org/ftp/arxiv/papers/1508/1508.05164.pdf> abstract, figures 1A, 1B & 1C, p. 2, paragraphs 2-4, p. 3, paragraphs 1-3, p. 4, paragraph 2 (11 pages total).

International Search Report and Written Opinion dated Feb. 8, 2017, issued in connection with corresponding International Application No. PCT/US16/55960 (11 pages total).

C. W. Hsu et al., "Observation of trapped light within the radiation continuum", Nature 499, 188-191 (2013) (5 pages total).

T. Lepetit and B. Kanté, "Controlling multipolar radiation with symmetries for electromagnetic bound states in the continuum", Phys. Rev. B 90, 241103(R) (2014). (5 pages total).

Y. Yang et al., "Analytical perspective for bound states in the continuum in photonic crystal slabs", Phys. Rev. Lett. 113, 037401 (2014) (5 pages total).

* cited by examiner

| $C_{1H}$ | E | $C_2$ |
|---|---|---|
| A | +1 | +1 |
| B | +1 | -1 |

FIG. 3A

| $C_{4V}$ | E | $2C_4$ | $C_2$ | $2\sigma_v$ | $2\sigma_d$ |
|---|---|---|---|---|---|
| $A_1$ | +1 | +1 | +1 | +1 | +1 |
| $A_2$ | +1 | +1 | +1 | -1 | -1 |
| $B_1$ | +1 | -1 | +1 | +1 | -1 |
| $B_2$ | +1 | -1 | +1 | -1 | +1 |
| E | 2 | 0 | 2 | 0 | 0 |

FIG. 3B

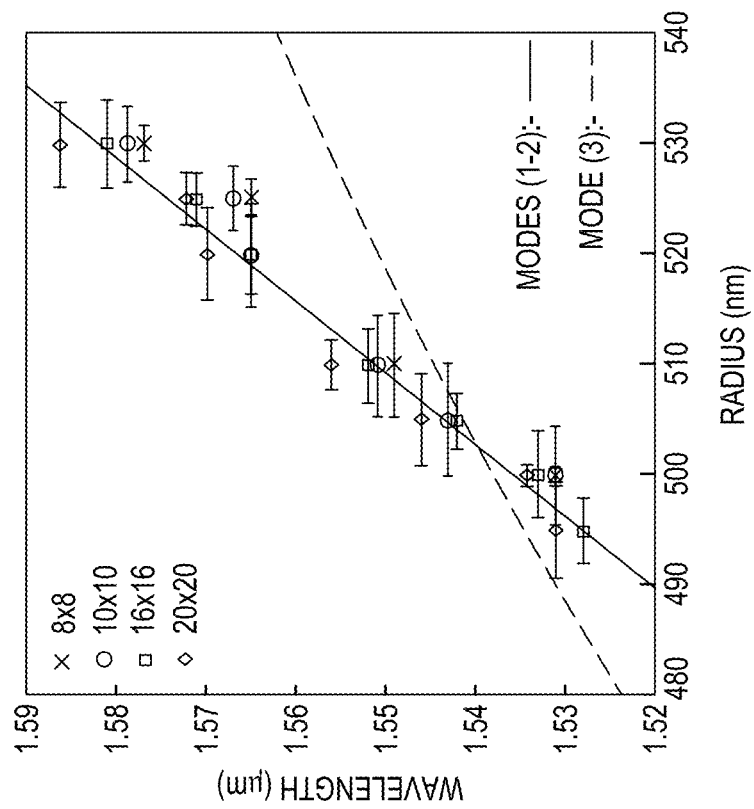
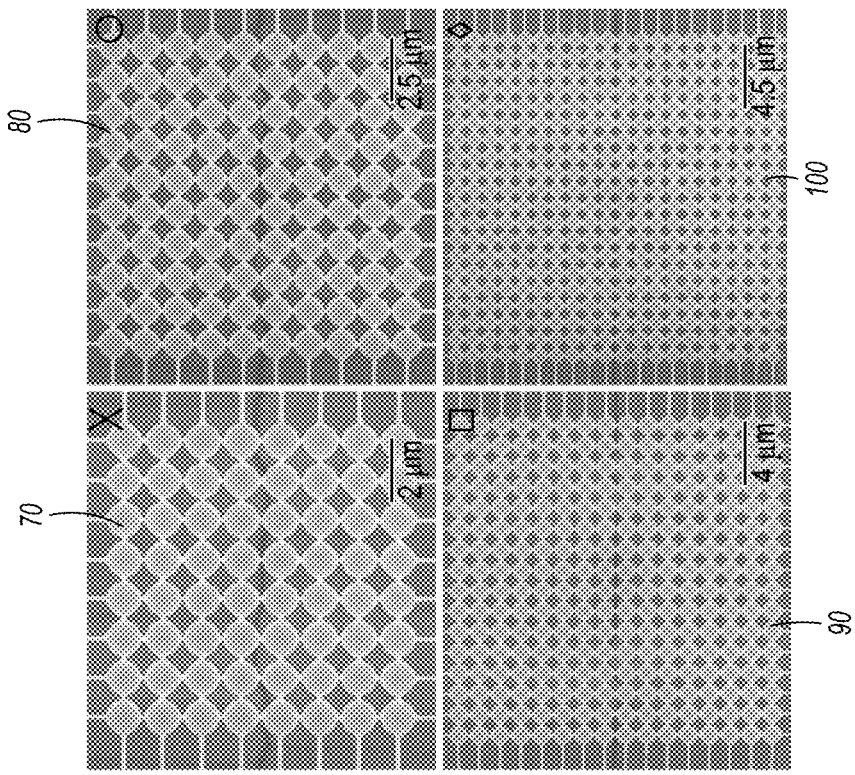
FIG. 7A
FIG. 7B

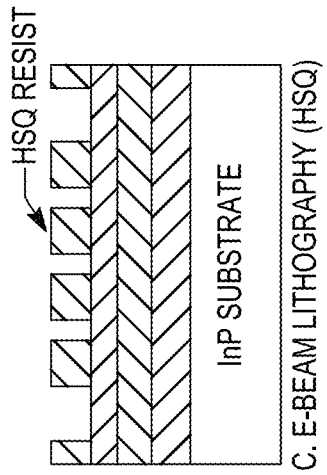
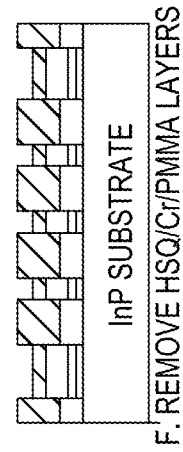
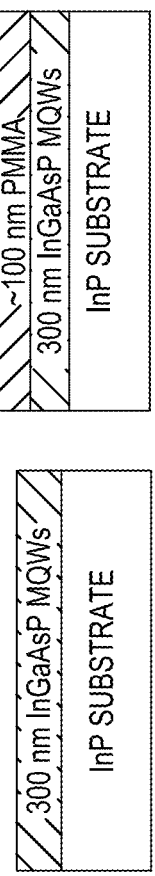
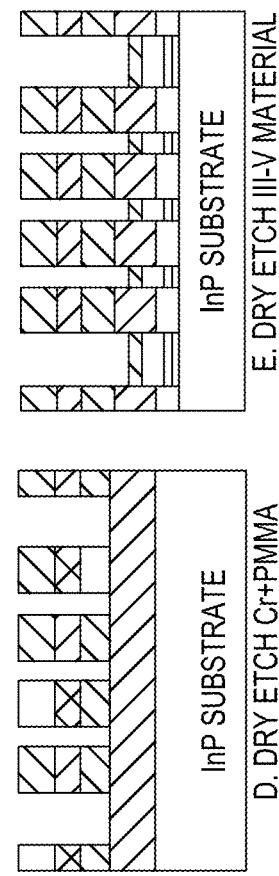
FIG. 10A  A. BARE WAFER
FIG. 10B  B. PMMA + Cr
FIG. 10C  C. E-BEAM LITHOGRAPHY (HSQ)
FIG. 10D  D. DRY ETCH Cr+PMMA
FIG. 10E  E. DRY ETCH III-V MATERIAL
FIG. 10F  F. REMOVE HSQ/Cr/PMMA LAYERS

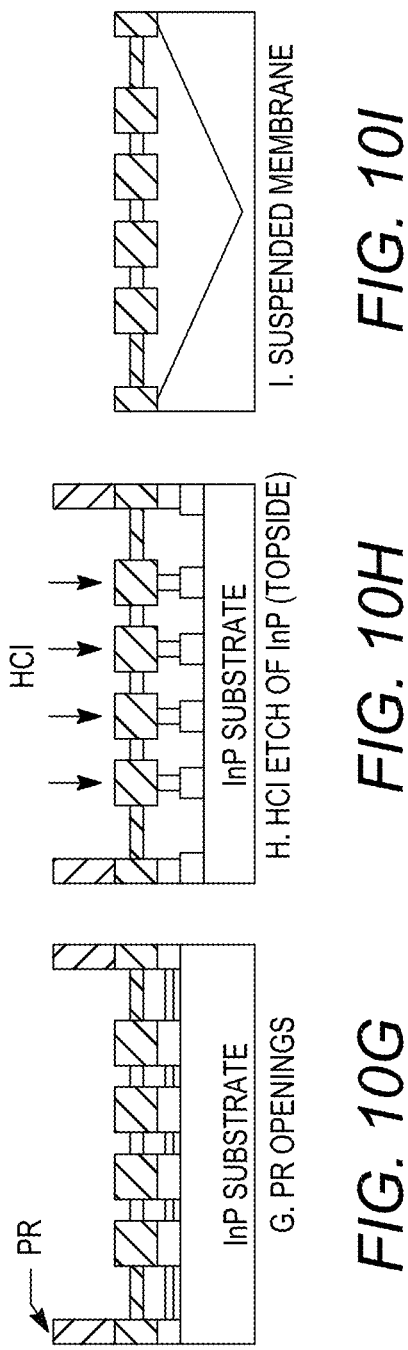

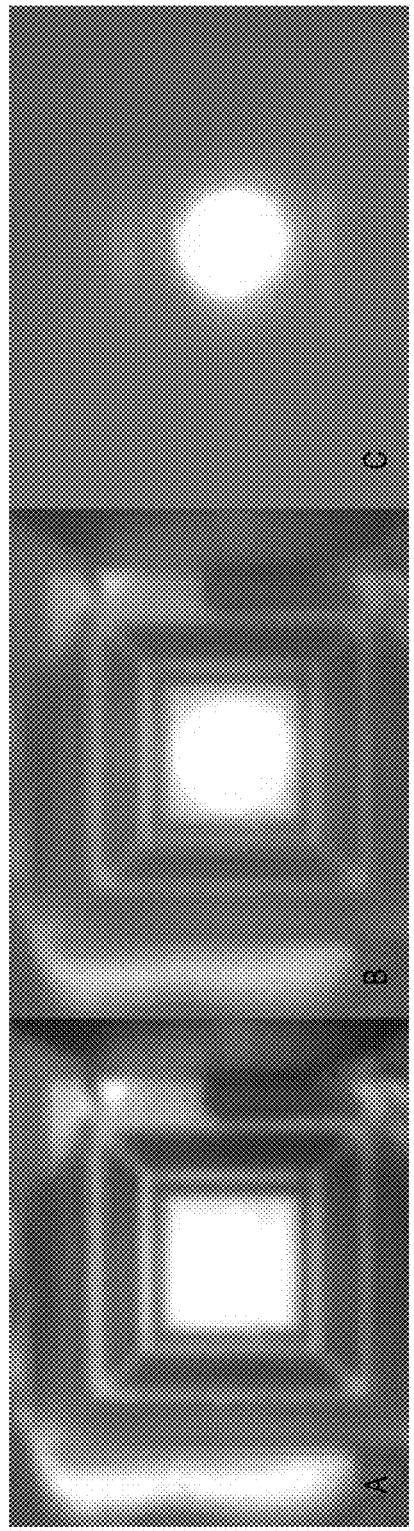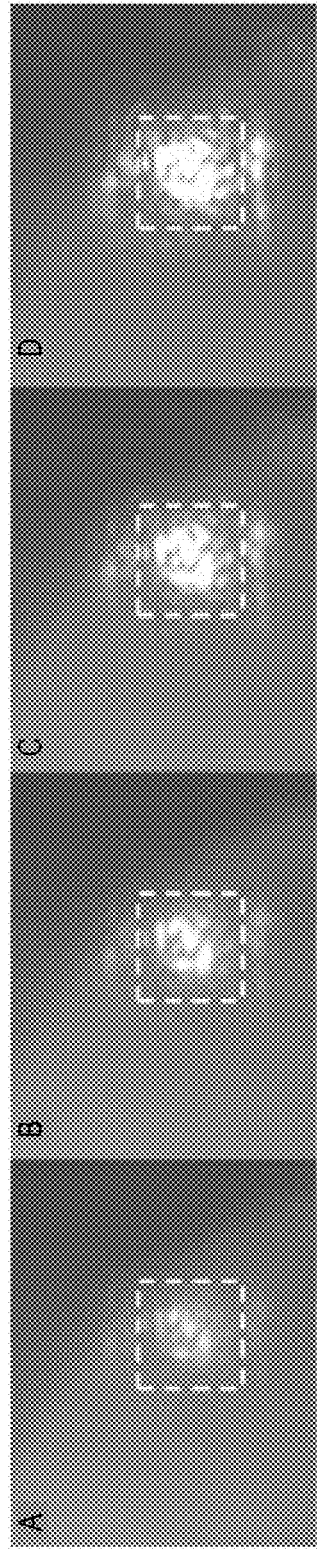

SYSTEM AND METHOD FOR BOUND STATE IN CONTINUUM LASER SOURCES

CROSS-REFERENCE TO RELATED APPLICATIONS

This application is a 371 of International Application No. PCT/US16/55960, filed Oct. 7, 2016, entitled "SYSTEM AND METHOD FOR BOUND STATE IN CONTINUUM LASER SOURCES", and claims benefit of priority of U.S. Provisional Patent Application Ser. No. 62/240,867, filed Oct. 13, 2015, entitled "SYSTEM AND METHOD FOR BOUND STATE IN CONTINUUM LASER SOURCES", owned by the assignee of the present application and herein incorporated by reference in its entirety.

FIELD

The invention relates to laser light sources.

BACKGROUND

In 1929, only three years after the advent of quantum mechanics, von Neumann and Wigner showed for the first time that Schrodinger's equation can have bound states above the continuum threshold. These peculiar states, called bound states in the continuum (BICs), manifest themselves as resonances that do not decay. For several decades after, the idea lay dormant in large part because it was regarded primarily as a mathematical curiosity. In 1977, Herrick and Stillinger revived interest in BICs when they suggested that BICs could be observed in semiconductor superlattices. More than a decade later, in 1992, BICs were observed experimentally in $Al_xIn_{1-x}As/Ga_yIn_{1-y}As$ superlattices.

BICs naturally arise from Feshbach's quantum mechanical theory of resonances, as explained by Friedrich and Wintgen, and are thus more physical than initially realized. Recently, it was understood that BICs are intrinsically a wave phenomenon and are not restricted to the realm of quantum mechanics. They have since been shown to occur in many different fields of wave physics including acoustics, microwaves, and nanophotonics. However, experimental observations of bound states in the continuum have been limited, e.g., to passive systems.

This Background is provided to introduce a brief context for the Summary and Detailed Description that follow. This Background is not intended to be an aid in determining the scope of the claimed subject matter nor be viewed as limiting the claimed subject matter to implementations that solve any or all of the disadvantages or problems presented above.

SUMMARY

Systems and methods according to present principles meet the needs of the above in several ways. In particular, systems and methods according to present principles are directed towards the creation of high quality factor cavities, via a bound state in the continuum (BIC), for, e.g., laser sources. A particular implementation of systems and methods according to present principles provide bound states in the continuum surface emitting lasers (BICSELs). These cavities achieve arbitrarily high quality factors, which are generally not limited by radiation, using optical modes residing within the continuum of radiation modes. This is unlike most laser cavities, which instead rely on optical modes residing below the continuum of radiation modes. This principle is based on the hybridization of two optical modes. When this occurs, one optical mode can trap the other in the continuum, turning it into a bound state. Coupling a BIC cavity with a gain medium results in an ultralow threshold laser source.

Exemplary applications include ultralow threshold coherent sources that can be integrated on chip for next-generation optical processing devices. Other applications include single photon sources, which rely on Purcell factor enhancement, that can be integrated on chip for future quantum communication devices. Even more applications include coherent vector beam sources that can be integrated on chip for trapping biological molecules and imaging their properties in real time. Other applications will be understood from the description that follows, including the specification and claims.

Without wishing to be bound by theory, it is believed that the unicity, novelty, and improvement brought about by systems and methods according to present principles stem from three points. First, laser cavities according to present principles do not require full field confinement, thus making the system easily accessible to external modulation. Second, its quality factor is theoretically unlimited, opening up perspectives for ultralow-threshold integrated sources as well as Purcell factor enhancement. Finally, BIC lasers are natural vector beam sources and their integration may strongly benefit the fields of optical trapping, biological imaging, and quantum communication.

In one aspect, the invention is directed to a bound state in the continuum laser, pumped by a source of light, the source of light configured to direct light into the laser, including a laser cavity, the cavity configured to enable a bound state in the continuum.

Implementations of the invention may include one or more of the following. The bound state in the continuum may be configured to enable resonantly trapped symmetry-compatible modes that destructively interfere. The cavity may be made of an array of cylindrical nanoresonators suspended in air. The array may be housed in a membrane of semiconductor material. The cavity may be made of a periodic array of nanoresonators interconnected by a network of supporting bridges. The laser may be tuned by adjusting the radius of the cylindrical nanoresonators. A radius of each nanoresonator may be fabricated to be between 500 nm and 550 nm. The radius of each nanoresonator may be fabricated to be between 510 nm and 540 nm. A threshold power of the laser may be configured to be less than about 80 μW. The nanoresonators may be constructed by electron beam lithography and reactive ion etching followed by a wet etching step. The laser may be configured to be a vertical cavity surface emitting laser. The nanoresonators may form multiple quantum wells, and an angle of emission may be based on the thickness of the multiple quantum wells.

In another aspect, the invention is directed towards a method of making a bound state in the continuum laser, including: a. providing a substrate; b. fabricating a device layer on the substrate, the device layer to be formed into multiple quantum wells; and c. fabricating a top barrier layer on the device layer.

Implementations of the invention may include one or more of the following. The top barrier layer may be formed of chromium. The chromium layer may have a thickness of between 20 nm and 40 nm. The substrate may be made of InP. The method may further include disposing a resist layer on top of the top barrier layer, and performing an etching step to create devices. The method may further include removing the top barrier layer. The method may further include removing a portion of the InP substrate to suspend the devices. The devices may be nano resonators. The nanoresonators may form cylindrical nanoresonators. The cylindrical nano resonators may be formed into an array, and the cylindrical nanoresonators may be connected by bridges.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

BRIEF DESCRIPTION OF THE DRAWINGS

FIGS. 3(A)-3(B) illustrate character tables indicating how each irreducible representation behaves with respect to each symmetry operation.

FIGS. 7(A) and 7(B) illustrate scaling of BIC lasers.

FIGS. 10(A)-10(I) illustrate a device fabrication process according to present principles starting with epitaxially grown multiple quantum wells on InP substrate and ending with the nanocylinder suspended membrane.

FIGS. 13(A)-13(C) illustrate CCD images of suspended laser arrays.

FIGS. 14(A)-14(D) illustrate far field emissions of laser arrays over multiple pump powers.

Elements are not to scale unless otherwise noted.

DETAILED DESCRIPTION

Cavities play a fundamental role in wave phenomena from quantum mechanics to electromagnetism and dictate the spatiotemporal physics of lasers. In general, they are constructed by closing all "doors" through which waves can escape. Systems and methods according to present principles provide a room temperature bound state in the continuum laser that harnesses optical modes residing in the radiation continuum but nonetheless possesses arbitrarily high quality factors and as such shows the first lasing action from a bound state in the continuum cavity. These counterintuitive cavities are based on resonantly trapped symmetry-compatible modes that destructively interfere.

Present results show that the lasing wavelength of fabricated BIC cavities, made of arrays of cylindrical nanoresonators suspended in air, scales with nanoresonators radii according to the theoretical prediction for the BIC mode. Moreover, lasing action from the designed BIC cavity persists even after scaling down the membrane to as few as 8-by-8 nanoresonators. BIC lasers open new avenues in the study of light-matter interaction as they are intrinsically connected to topological charges, and represent natural vector beam sources, which are highly sought after in the fields of optical trapping, biological sensing, and quantum information.

Generally, open systems are described by non-Hermitian effective Hamiltonians that have multivariate and complex eigenvalues describing modes of the system. These eigenvalues exist in a multidimensional space (hyperspace), but in a given frequency range, the investigation can be reduced to a finite number of variables, limiting the complexity of the effective Hamiltonian. When eigenvalues come close to crossing as a function of a geometrical parameter that modifies the system, avoided resonance crossing (ARC) occurs, i.e., eigenvalues repel each other in the entire complex plane. Friedrich and Wintgen showed that resonantly trapped BICs represent a particular type of ARC for which coupling occurs predominantly in the far field.

Figure 1:
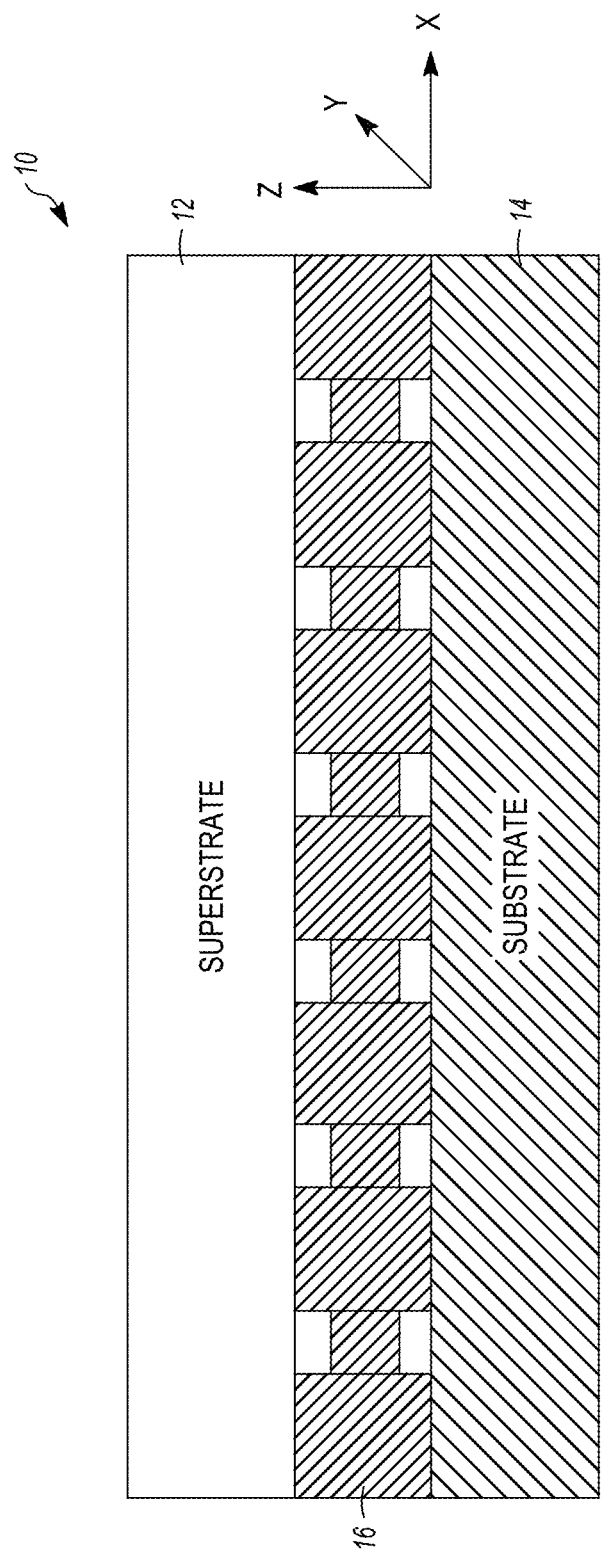
FIG. 1 illustrates an X-Y periodic slab embedded in a multilayer stack.

In more detail, FIG. 1 shows an X-Y periodic slab 10 embedded in a multilayer stack, to form a superstrate 12-slab 16-substrate 14 structure. In one implementation, the substrate and the superstrate are the same material, i.e., air.

Feshbach's formalism for coupled-channels is used to explain the notion of open and closed channels. Helmholtz's equation for the electric field (sign convention, +jωt), in a medium that includes several layers along z (homogeneous or periodic), is given by:

$$\nabla^2 E(p,z) + k^2_0 \varepsilon_r(p,z) E(p,z) = 0 \tag{1}$$

where p is the in-plane position vector. All layers can be considered to be periodic along x and y (see FIG. 1).

For all z, the permittivity verifies:

$$\varepsilon_r(p+R,z) = \varepsilon_r(p,z) \tag{2}$$

where R is the direct lattice vector. The permittivity can thus be expanded in a Fourier series:

$$\varepsilon_r(\rho, z) = \sum_G \varepsilon_G(z) e^{-jG\cdot\rho} \tag{3}$$

$$\varepsilon_G(z) = \frac{1}{S} \int\int \varepsilon_r(\rho, z) e^{-jG\cdot\rho} d\rho \tag{4}$$

where G is the reciprocal lattice vector and S is the unit cell surface area. The electric field has to satisfy Bloch's theorem:

$$E(p,z) = e^{-jk\cdot p} E^n(p,z) \text{ with } E^n(p+R,z) = E^n(p,z) \tag{5}$$

Bloch fields are plane waves with a periodic envelope. Since these envelopes are periodic functions, they can also be expanded in Fourier series:

$$E(\rho, z) = e^{-jk \cdot \rho} \sum_G E_G^n(z) e^{-jG \cdot \rho} \quad (6)$$

$$E_G^n(z) = \frac{1}{S} \int\int E^n(\rho, z) e^{-jG \cdot \rho} d\rho \quad (7)$$

A system of Ordinary Differential Equations (ODE) is then obtained that is valid in all layers (superstrate-membrane-substrate) along z:

$$\left(\frac{d^2}{dz^2} + k_0^2 \varepsilon_0(z) - (k+G)^2\right) E_G^n(z) = -k_0^2 \sum_{G \neq G'} \varepsilon_{G-G'}(z) E_{G'}^n(z) \quad (8)$$

Eq. (8) has a structure similar to that of the equation describing Fano-Feshbach resonances. Fourier components $E''_G(z)$ are called channels and this equation is thus referred to as a coupled-channels equation. In Eq. (8), channels are only coupled by the term on the right-hand side, i.e., by the higher-order Fourier coefficients of the permittivity $\varepsilon_{G-G'}(z)$. This means that channels are only coupled in non-homogeneous media.

In homogeneous layers, Eq. (8) reduces to:

$$\left(\frac{d^2}{dz^2} + k_0^2 \varepsilon_0(z) - (k+G)^2\right) E_G^n(z) = 0 \quad (9)$$

and channels are thus no longer coupled. In homogeneous layers that extend to infinity, channels are also referred to as decay channels and are classified into open and closed decay channels, depending on their asymptotic behavior:

$$k_0^2 \varepsilon_0(\pm\infty) - (k+G)^2 > 0 \text{ (open or propagating)} \quad (10)$$

$$k_0^2 \varepsilon_0(\pm\infty) - (k+G)^2 < 0 \text{ (closed or evanescent)} \quad (11)$$

In sub-wavelength periodic structures, there is only one propagating order or, put otherwise, one open channel. All other channels are closed. In a typical scattering experiment, the incident and scattered waves are sent and collected through the only open channel but the result of the experiment originates from the complex interferences amongst all coupled channels in the periodic medium.

In one implementation of present systems, the suspended homogenous membrane is described by Eq. (8) without the right-hand side. After periodically nano-structuring this homogenous membrane, the system is described by Eq. (8) with the right-hand side. If an initially guided state of the homogeneous membrane turns into a leaky state of the periodically structured membrane, a Fano-Feshbach resonance occurs. Most of these Fano-Feshbach resonances have a finite lifetime but a careful engineering of the coupling amongst channels, via $\varepsilon_{G-G'}(z)$, can result in resonances whose lifetime tends towards infinity, i.e., bound states in the continuum.

Referring to FIG. 2, the complex dispersion relation is plotted for both odd and even modes (xy-mirror plane), in the wavelength range from 1.45 µm to 1.67 µm. In more detail, FIG. 2 illustrates the complex dispersion relation as function of k (a/2π) of the structure along MΓ and ΓX in the wavelength range from 1.45 µm to 1.67 µm and for a BIC radius of 528.4 nm. FIGS. 2A and 2B illustrate odd modes, and in particular a frequency versus phase relation and a quality factor versus phase relation. FIGS. 2C and 2D illustrate the same for the even modes.

Figure 2A:
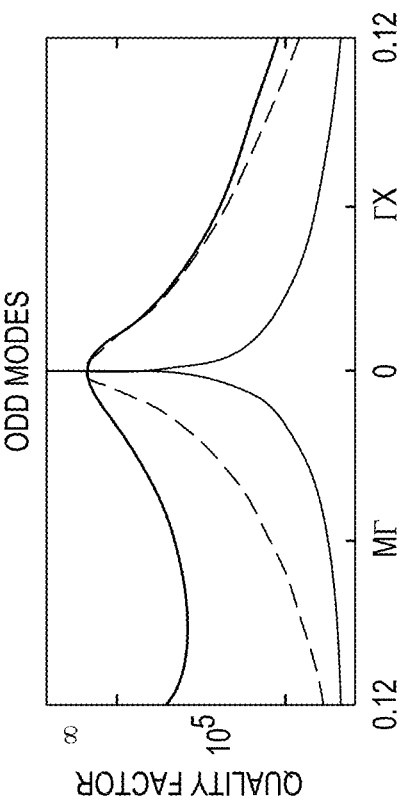
FIGS. 2(A)-2(D) illustrate complex dispersion relations as a function of k (a/2π) of the structure along MΓ and ΓX in the wavelength range from 1.45 µm to 1.67 µm and for a BIC radius of 528.4 nm.
Figure 2B:
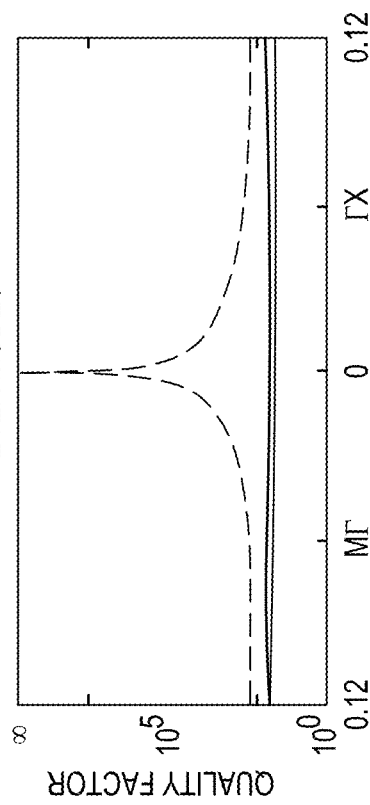
Figure 2C:
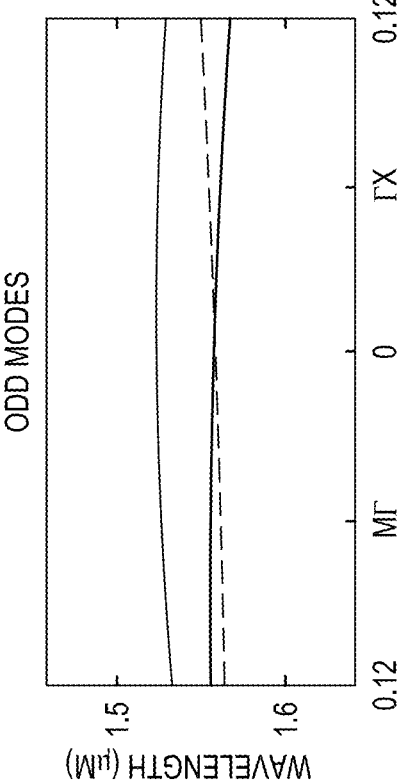
Figure 2D:
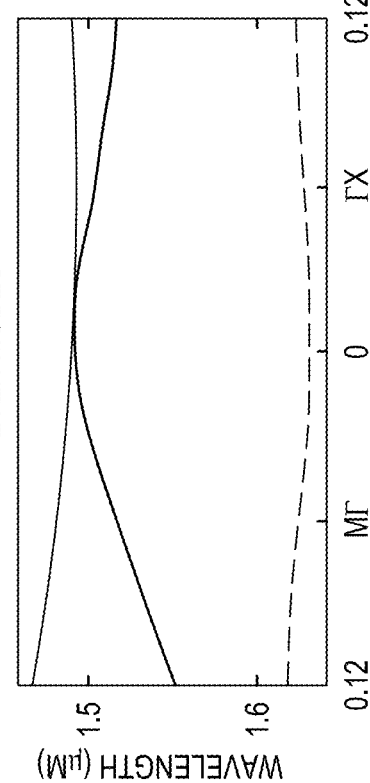

As can be seen in the figure, there are three odd modes and three even modes in this wavelength range. No mode has a higher overall quality factor than the two odd modes (doubly degenerate at Γ) around 1.55 µm, which are the BIC modes (FIG. 2B, dotted and bold lines). In addition, there are two symmetry-protected modes, one odd and one even, whose quality factor is high only at Γ (FIG. 2B, normal and FIG. 2D, dotted lines). Finally, there is a pair of even modes that are degenerate at Γ with a low quality factor (FIG. 2D, normal and bold lines).

The distinction between the 'resonance trapped' BIC mode and 'symmetry protected' mode is further evident in the context of group theory. Spatial symmetries of a photonic crystal can be used to classify its modes. The point group of a square-lattice photonic crystal slab suspended in air is the direct product of point groups C4v and $C_{1h}$. Accordingly, its modes can be classified using the irreducible representations of both point groups. FIGS. 3A and 3B illustrate character tables that explain how each irreducible representation behaves with respect to each symmetry operation.

Therefore, there are ten different modes that can exist in such a lattice. Consideration is restricted to modes with an odd symmetry with respect to the xy plane, and thus only five are left: $(B,A_1)$, $(B,A_2)$, $(B,B_1)$, $(B,B_2)$, and $(B,E)$. At Γ, plane waves in free space admit an E representation and can thus only couple to $(B,E)$ modes. All other modes are uncoupled by virtue of symmetry, i.e. they form symmetry-protected BICs. This was first reported by Paddon and Young, which showed that such modes have an infinite Q-factor.

Furthermore, $(B,A_1)$, $(B,A_2)$, $(B,B_1)$, and $(B,B_2)$ modes are all singly degenerate while the $(B,E)$ mode is doubly degenerate. In the band diagram of FIG. 2C, one singly degenerate mode at 1520 nm and one doubly degenerate mode at 1558 nm can be seen clearly. From the above symmetry considerations, it is thus expected that only the lower wavelength mode have an infinite Q-factor. However, it can be seen that this is not the case. This means that the doubly degenerate mode is not a BIC by virtue of symmetry-protection. It is a resonance-trapped BIC that results from destructive interferences. Unlike previous works, it is thus shown here that such BICs do not always happen away from high-symmetry points. Additionally, it is worth noting that the lasing structure according to present principles fundamentally differs from the other work, where lasing originates from a symmetry protected mode.

In more detail, systems and methods according to present principles in one implementation include a thin membrane of semiconductor material suspended in air. The field in the air is a superposition of plane waves, which are interpreted as independent decay channels, and can be either propagating or evanescent. The membrane is subsequently structured at the nanoscale. The field in the membrane, which becomes a superposition of coupled plane waves due to structuring, is also coupled to the field in air. In the resulting open system described by a non-Hermitian Hamiltonian, resonance lifetime is governed by coupling amongst different channels. The imaginary part of the complex frequency serves to quantify the decay of modes. BICs arise when complex frequency modes (in the continuum) interfere destructively to give a purely real frequency mode. They are very peculiar discrete modes in that they are actually embedded within the continuous spectrum but intrinsically possess an infinitely high radiation quality factor as a result of their non-decaying nature. BICs are thus ideally suited for the design of perfect nanophotonic cavities.

As shown in FIG. 4, a BIC cavity according to one implementation is composed of a periodic array of nanoresonators of radius R interconnected by a network of supporting bridges used for the mechanical stability of the system. In one implementation, the membrane includes several $In_xGa_{1-x}As_yP_{1-y}$ multiple quantum wells, designed to operate around telecommunication wavelengths ($\lambda\sim1.55$ µm). In an implementation, the radius of the nanocylinders is the only parameter used to tune the modes of the membrane and alter the effective Hamiltonian. The structure may be fabricated using electron-beam lithography and reactive ion etching (RIE) to define the cylindrical resonators, followed by a wet etching step to create the membrane. The radius of the fabricated nanoresonators is generally smaller than their nominal design values, a consequence of RIE. As a result, the maximum achievable radius is generally smaller than p/2, where p is the period of the structure.

Figure 4C:
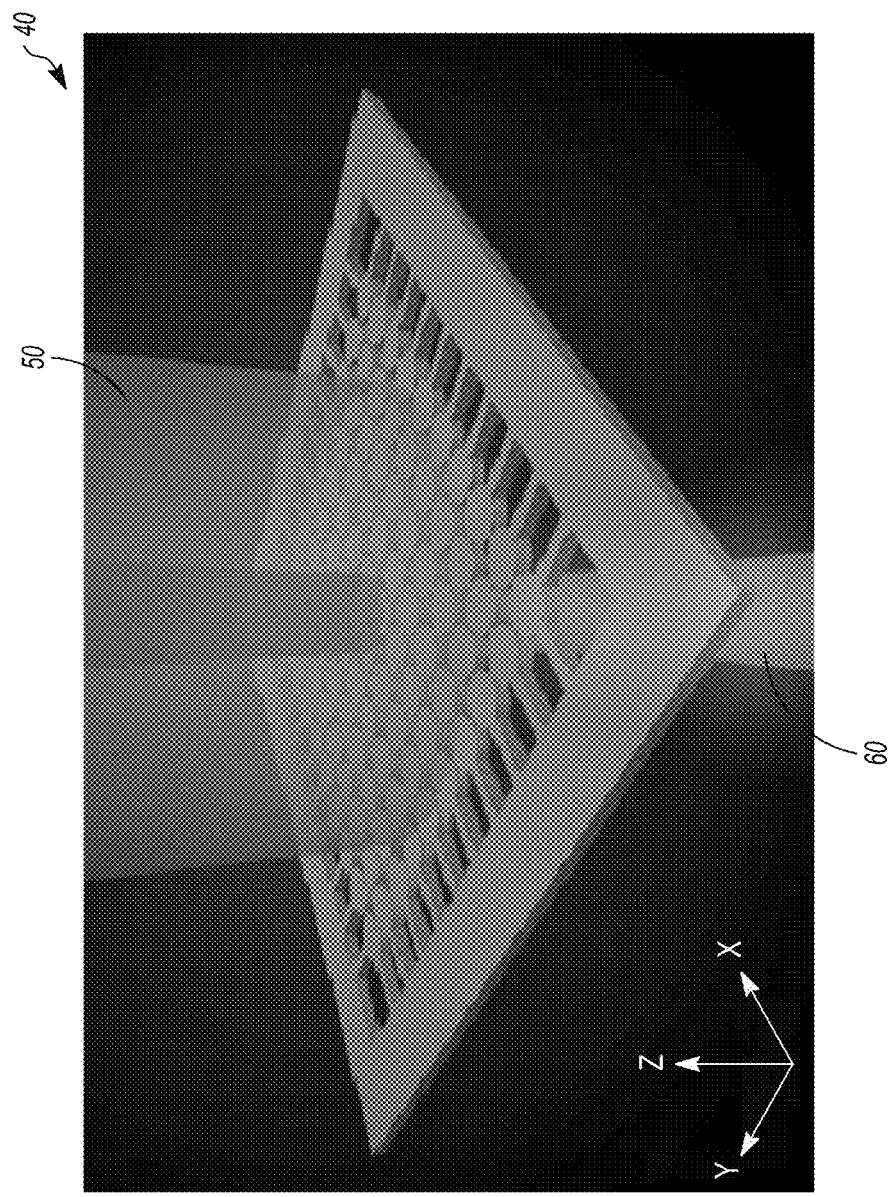
FIGS. 4(A)-4(C) illustrate, respectively, a tilted electron micrograph of quantum wells in an array suspended in air, a top view of an array with supporting bridges, and a schematic of the fabricated system illustrating a pump beam and lasing from the BIC mode.
Figure 4A:
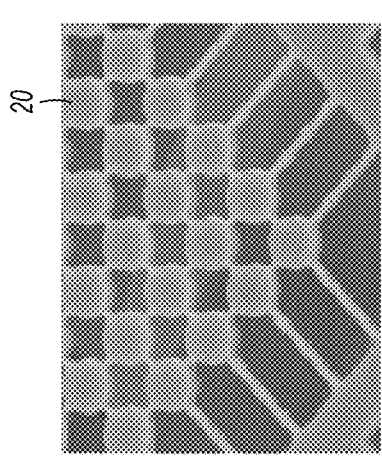
Figure 4B:
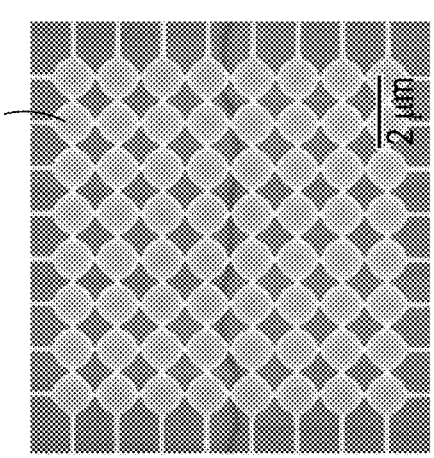

In more detail, FIG. 4(A) shows a tilted electron micrograph of InGaAsP multiple quantum wells in a cylindrical nanoresonator array suspended in air. All structures are fabricated using electron beam lithography followed by reactive ion etching to form of cylinders. Wet etching is subsequently used to suspend the structure. FIG. 4(B) shows a top view of an 8×8 array with supporting bridges, which are used for the mechanical stability of the membrane. The dimensions of the structure are: period=1200 nm, thickness=300 nm, and bridge width=100 nm. FIG. 4(C) illustrates a schematic of the fabricated system illustrating the larger pump beam 50 and lasing from the bound state in the continuum mode 60. The radius of the nano cylinders is an important parameter in the BIC design.

To analyze the system, the quality factors were calculated at normal incidence around 1.55 µm where the material gain peaks. The discussion is restricted to odd modes (transverse magnetic like) as they have much higher quality factors than even modes (transverse electric like) in the frequency range of interest. Three modes were found around 1.55 µm with appreciable quality factors, one doubly degenerate mode (modes 1-2) and one singly degenerate mode (mode 3).

Figure 5B:
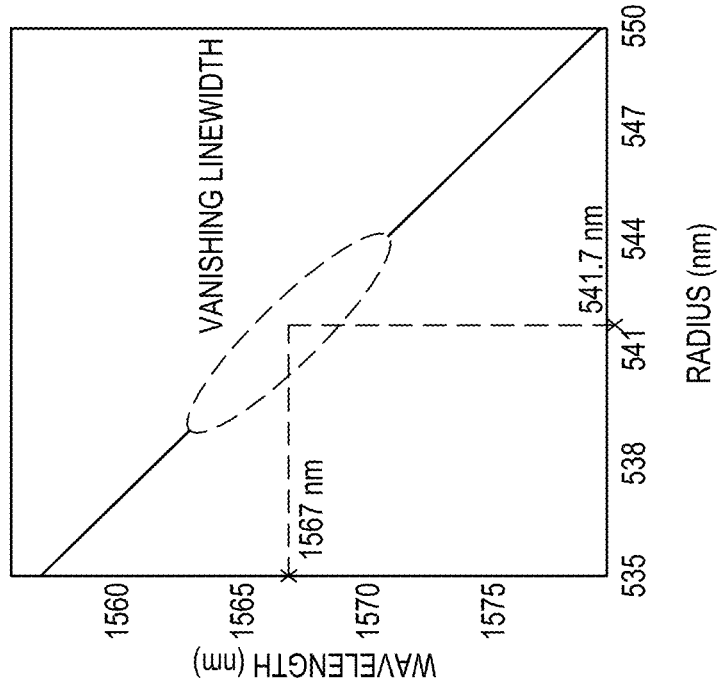
FIGS. 5(A)-5(F) illustrate design and complex dispersion relations of the BIC cavity.
Figure 5A:
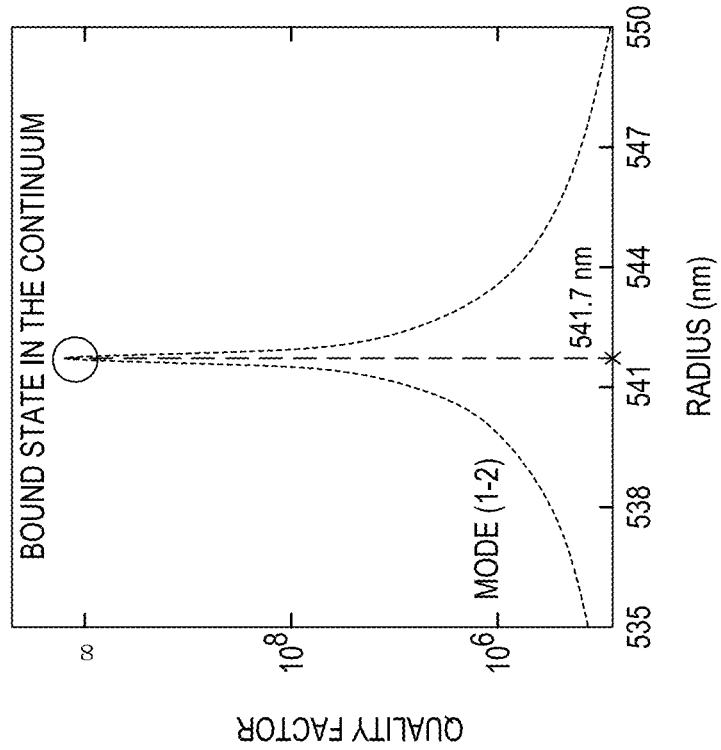

FIG. 5(A) shows their quality factor as a function of the radius (535 nm≤R≤550 nm). The quality factor of mode 3 is independent of the radius and remains high throughout the calculated range. This mode corresponds to a symmetry-protected mode. In contrast, the quality factor of modes 1-2 strongly depends on the radius, and continuously varies between the smallest radius (R=535 nm) and the largest radius (R=550 nm), and reaches a maximum at an optimum radius of $R_{opt}$=541.7 nm. At this optimum radius, modes 1-2 completely decouple from the radiation continuum and thus become BICs. It will be understood that dimensions may change if new materials are selected or if a new wavelength is selected for the laser.

Figure 6B:
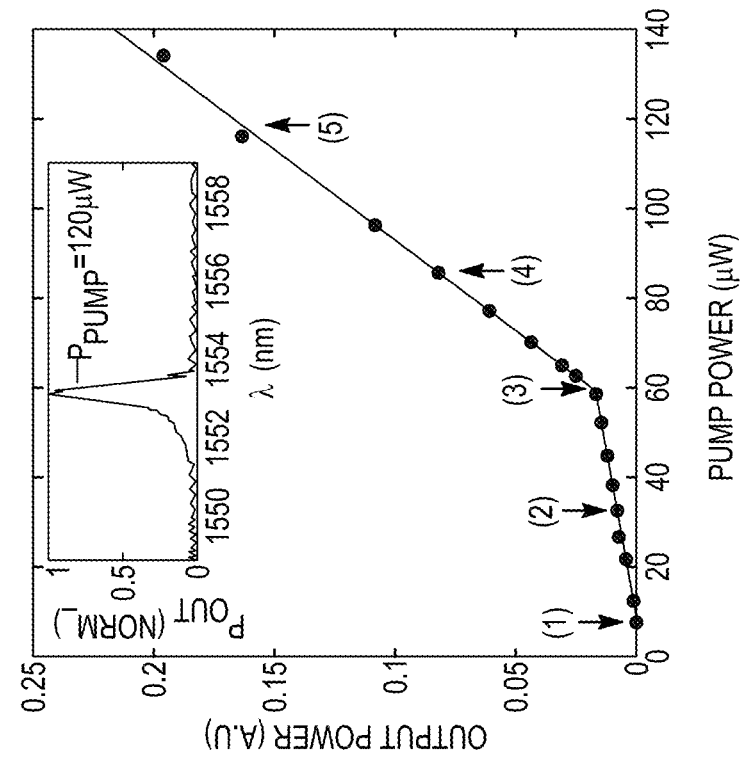
FIGS. 6(A) and 6(B) illustrate experimental characterization of a BIC laser.

The quality factor can diverge in two situations depending on whether consideration is of an isolated resonance or trapped resonances. In the first situation (isolated resonances, mode 3), coupling to the outside vanishes solely as a result of symmetry protection. Any perturbation that preserves symmetry, such as a modification of the radius, generally has no impact on its quality factor. This type of mode has been extensively studied before. In the second situation (trapped resonances modes 1-2), coupling to the outside vanishes as a result of destructive interference. Resonantly trapped BICs achieve an infinite quality factor at the singular radius $R_{opt}$ but the quality factor remains very high for radii around $R_{opt}$. FIG. 6(B) shows the transmission spectrum at normal incidence of the structure in which the infinite quality factor of modes 1-2 can be seen from the vanishing linewidth.

Figure 5D:
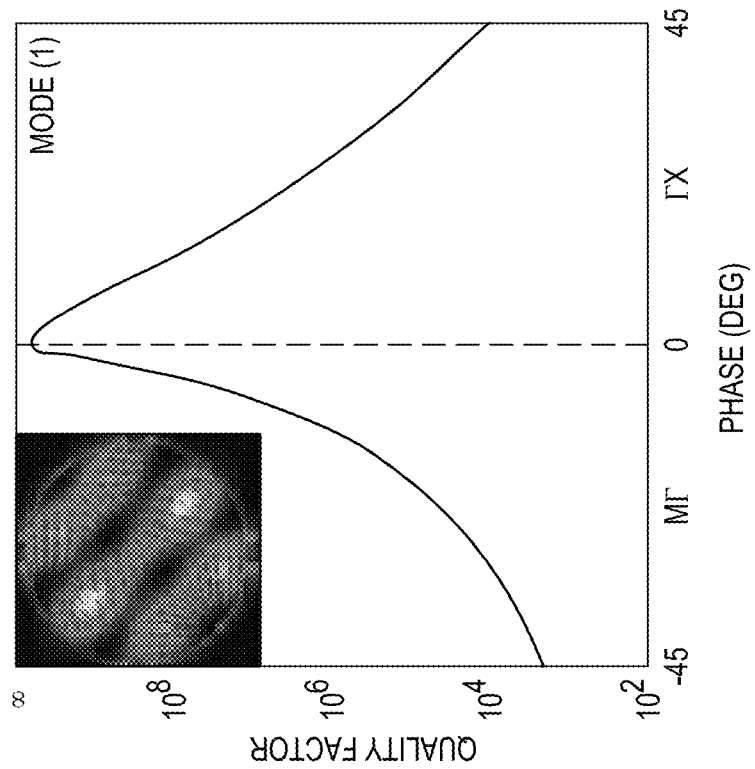
Figure 5C:
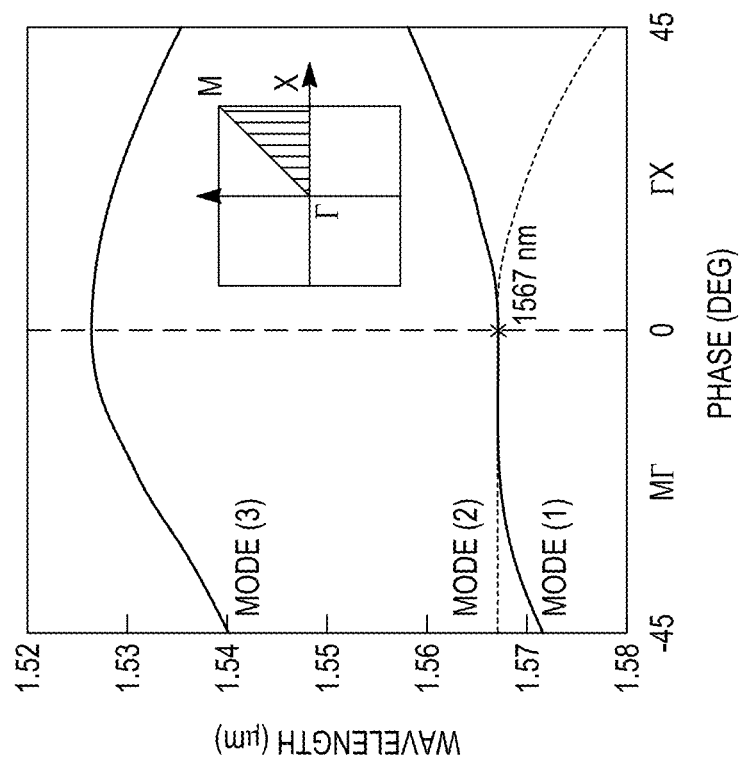

FIG. 5C shows the dispersion relation around 1.55 µm for high-Q modes (1, 2 and 3) in both MΓ and ΓX directions. The inset shows the first Brillouin zone of the square lattice and irreducible contour for cylindrical nanoresonators (shaded area). The contour connects high-symmetry points Γ, X, and M.

Figure 5F:
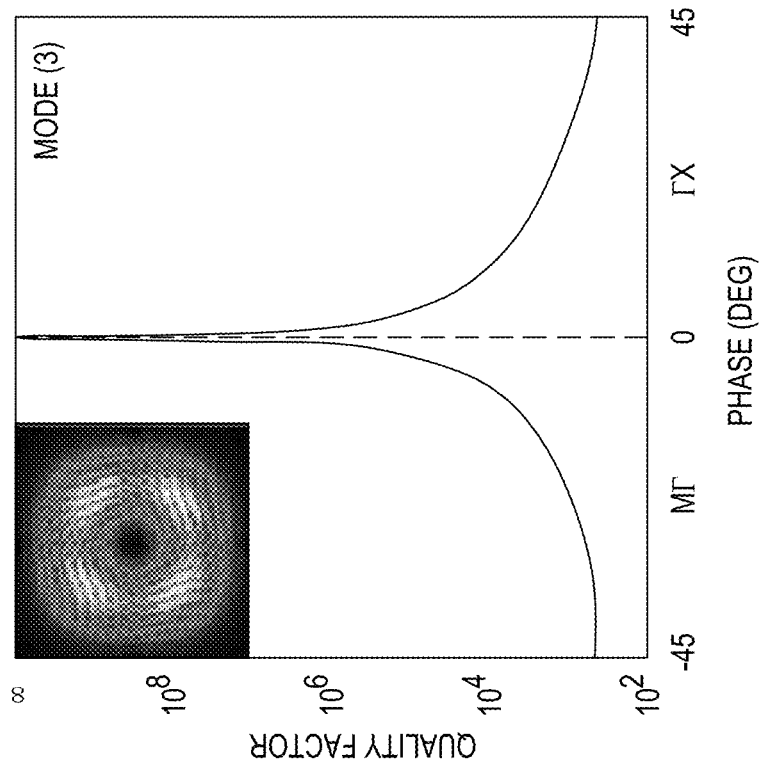
Figure 5E:
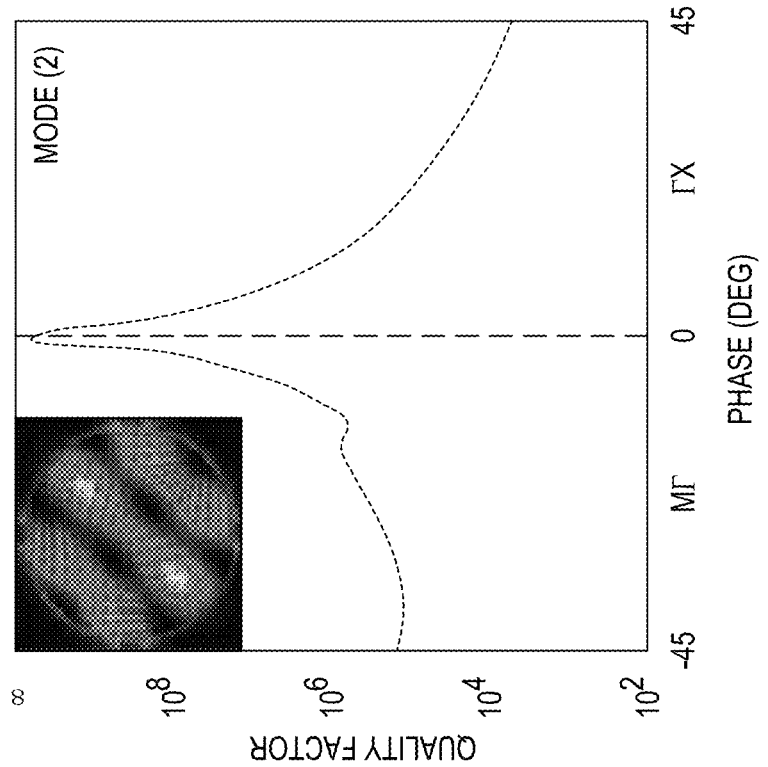

In particular, the figure shows the dispersion relation of the BIC structure at R=$R_{opt}$ along MΓ and ΓX. The complex dispersion relation is plotted of modes 1-2 (FIG. 5D-E) and mode 3 (FIG. 5F). FIG. 5F shows that mode 3 is extremely sensitive to symmetry-breaking perturbations as its quality factor drops sharply away from the Γ point. Quality factors of modes 1-2, which are no longer degenerate away from the Γ point (as seen in FIG. 5C), do not drop as sharply as that of mode 3. Modes 1-2 are thus much less sensitive to symmetry-breaking perturbations. Additionally, the resonance-trapped BIC is robust because a variation in radius only induces its displacement in k-space whereas a symmetry-breaking perturbation destroys the symmetry-protected mode. This is of importance in device design as fabrication tolerances will have less impact on resonance-trapped BIC than on modes that rely on symmetry protection. Moreover, designing a mode with a high quality factor in a large region of k-space is of practical importance because fabricated devices, which are never infinite, always sample the dispersion relation in a finite neighborhood in k-space. Therefore, for a given quality factor, a much smaller device footprint can be achieved with a resonance-trapped BIC mode than with symmetry-protected modes.

As noted above, the insets represent the normalized electric field on the surface of the cylinder. Modes 1 and 2 are identical under 90-degree rotation. Mode 3 is a symmetry protected mode and is thus not affected by geometrical changes that preserve symmetry, such as the change of radius. The quality factor of mode 3, however, drops rapidly away from the high symmetry point Γ. It drops more rapidly compared to the quality factor of mode 1-2. The sharper drop of the quality factor of mode 3 away from Γ implies that the integrated quality factor of this mode will be smaller than those of modes 1 and 2 in the case of finite-sized samples.

Figure 6A:
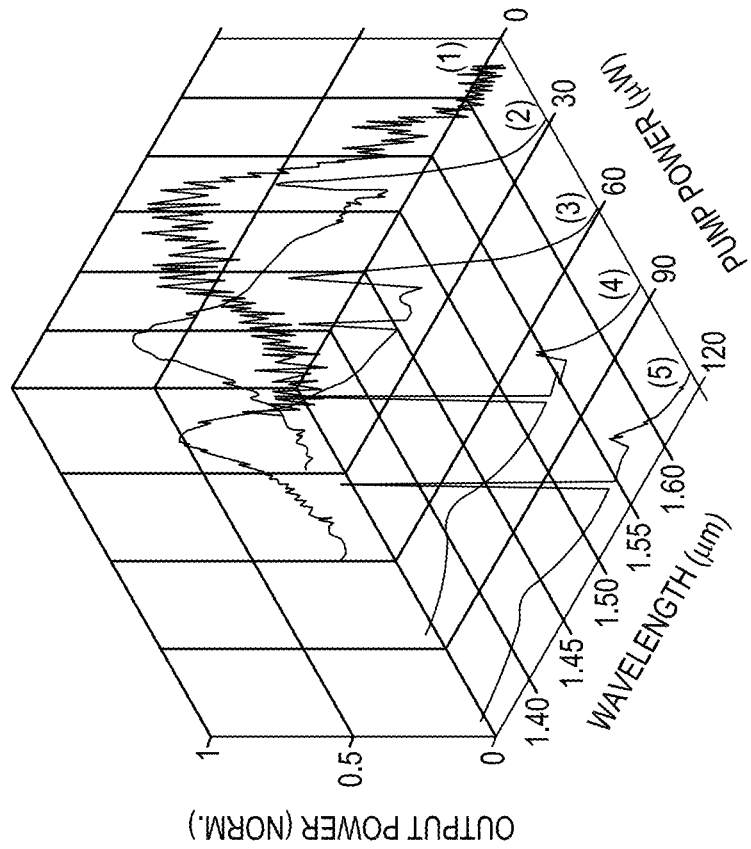

To experimentally demonstrate lasing from the BIC cavity, we optically pump the membrane is optically pumped at room temperature with a pulsed laser ($\lambda$=1064 nm, T=12 ns pulse at f=300 kHz repetition rate) and the spectral emission is recorded. FIG. 6(A) shows the evolution of the output power as a function of both the pump power and the wavelength for a 20×20 array with a nanoresonator radius of 507 nm. At low pump power, a spectrally broad photoluminescence spectrum was observed, while at high pump power, a drastic overall suppression of the photoluminescence was observed in favor of one extremely narrow peak, i.e., lasing. As depicted in FIG. 6(A), three modes show amplification at first ($P_{pump}\sim60$ µW) but, ultimately, only one remains ($P_{pump}\sim120$ µW). Lasing action occurs at a wavelength of 1553.2 nm with a linewidth of 0.52 nm (see inset of FIG. 6(B)). FIG. 6(B) shows the evolution of the output power as a function of the pump power around this lasing wavelength. A clear threshold behavior was observed with a threshold power of 62 µW or a density of 108 mWmm$^{-2}$. The dots correspond to measurements and numbers 1 through 5 denote spectra plotted in 6(A). The inset shows the lasing spectrum at a pump power of 120 µW (number 5) with a linewidth of 0.52 nm.

To further demonstrate the robustness and scalability of the BIC laser, several devices were fabricated with a range of radii and array sizes. FIG. 7(A) shows the measured lasing wavelength of devices of different array size (8×8 (cross), 10×10 (circle), 16×16 (square), and 20×20 (diamond)), and different radii of nanoresonators (495 nm-530 nm). Each point corresponds to a device with a specific radius and array size. Error bars indicate the standard deviation of radii measured from fabricated devices. The lines represent the theoretical resonant wavelength of modes 1-2 (solid line) and 3 (dashed line) for different radii of nanoresonators, for the infinite array. The good agreement between the experimental lasing wavelengths and the theoretical resonant wavelengths of the resonance-trapped BIC mode (mode 1-2) confirms that lasing action is indeed from the BIC mode over the entire range of radii. Moreover, the persistence of lasing for all array sizes down to as few as 8-by-8 resonators shows the scalability of the BIC laser, in large part due to the large quality factor of the resonance-trapped BIC mode in a wide region of k-space.

FIG. 7(B) illustrates electron micrographs of fabricated BIC lasers of size 8-by-8, 10-by-10, 16-by-16, and 20-by-20.

As noted above, it is desired to have a low threshold for a surfaced based laser, and present systems and methods allow such by operating the laser in the "bound state in the continuum singularity."

Figure 8A:
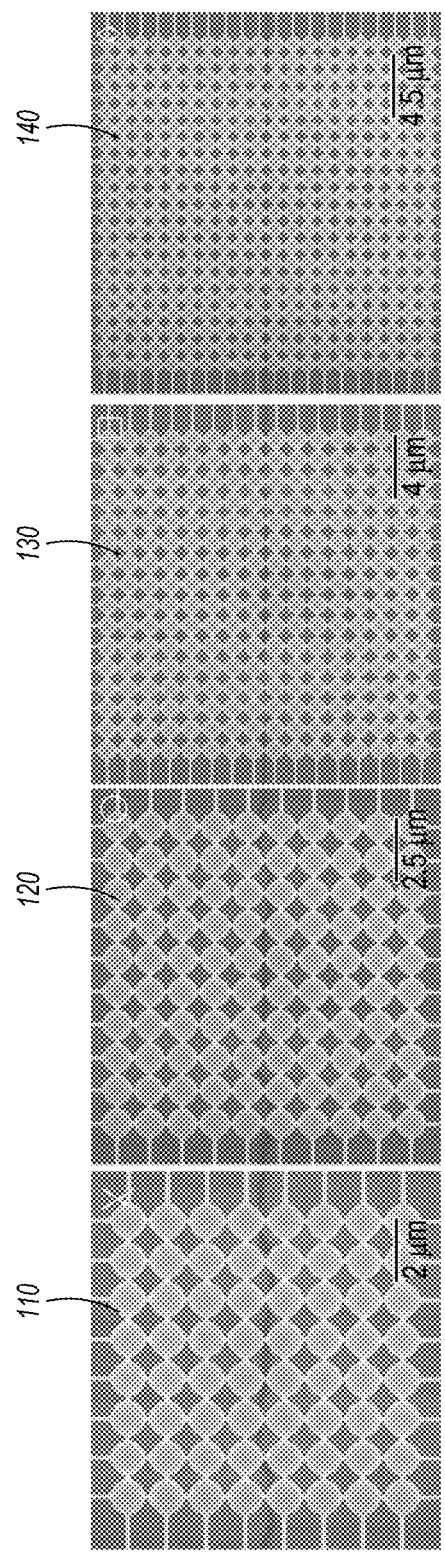
FIG. 8(A) illustrates a number of sizes of arrays of resonators.
Figure 8B:
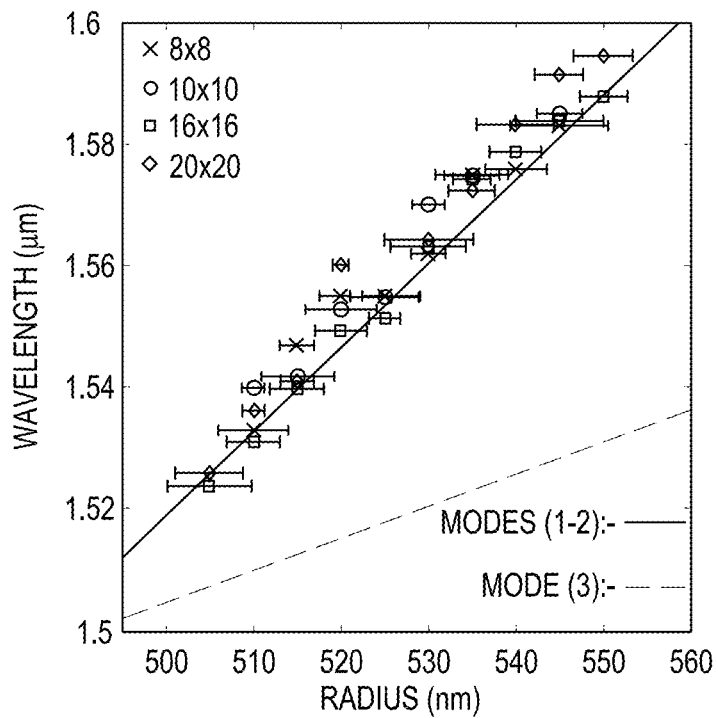
FIG. 8(B) is a chart of lasing wavelength versus radius of resonator.
Figure 9:
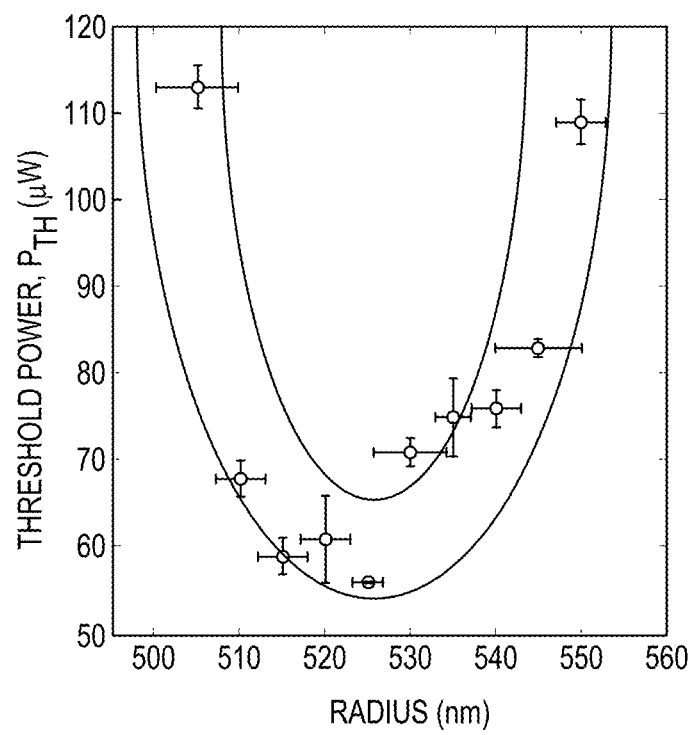
FIG. 9 is a chart of threshold power versus radius of resonator.

FIG. 8A illustrates various arrays of resonators 110, 120, 130, and 140. Array 110 is an 8×8 array of resonators, array 120 is a 10×10 array, array 130 is a 16×16 array, and array 140 is a 20×20 array. FIG. 8B shows the wavelength as a function of radius, and FIG. 9 shows the threshold power as a function of radius. As may be seen from FIG. 9, a resonator radius of around 525 nm is where the threshold power of the laser is a minimum. By operating close to this minimum, or whatever minimum is provided by the given lasing system, one can achieve a highly efficient laser. In a current system, the lasing is optically pumped. However, in other implementations, the system may be electrically pumped.

Figure 10J:
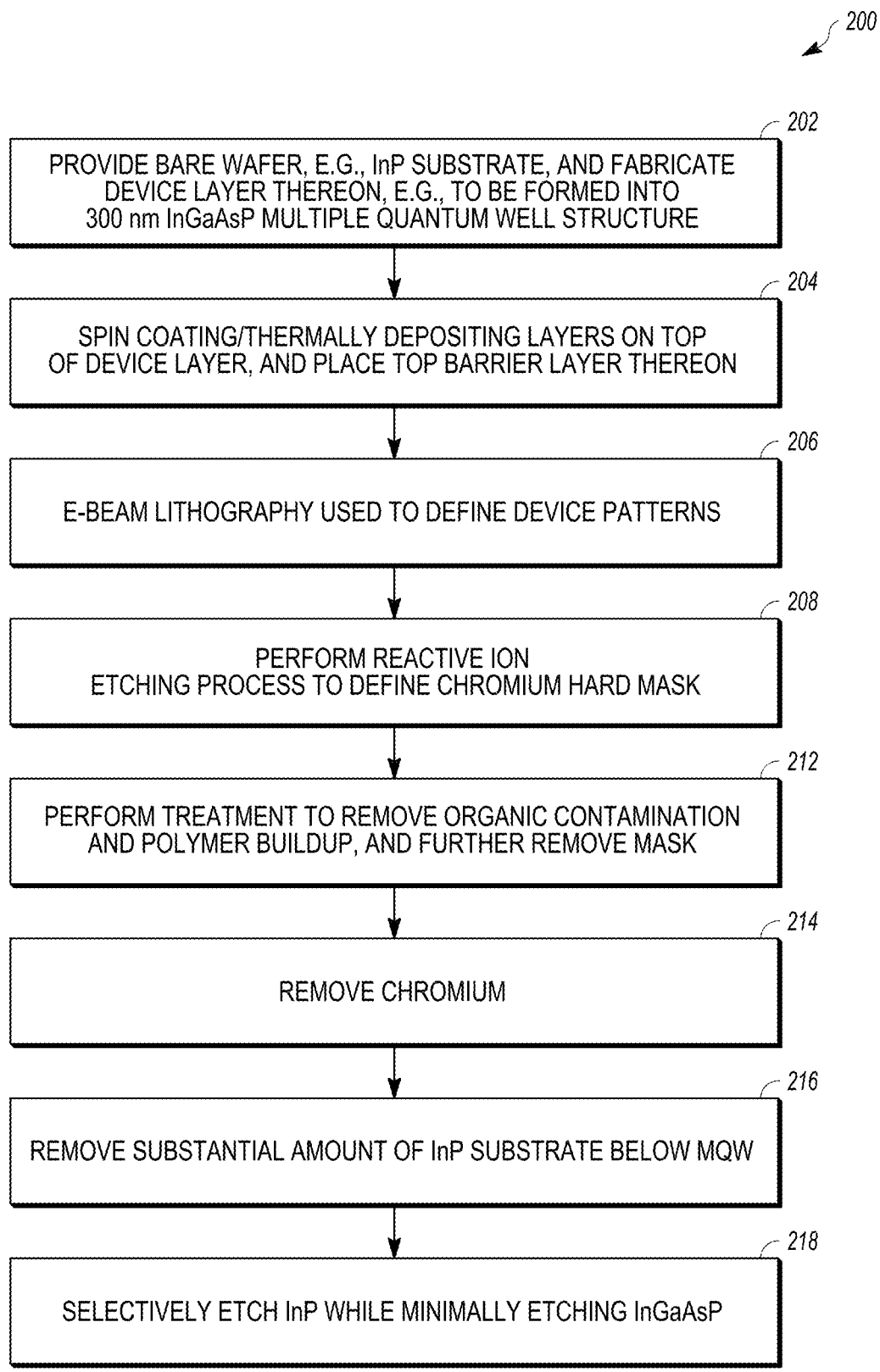
FIG. 10(J) is a flowchart of an exemplary manufacturing process according to present principles.

In one implementation, and referring to FIG. 10, BIC lasers according to present principles are fabricated using nanofabrication techniques. The active medium may be chosen to be epitaxially grown multiple quantum wells of InGaAsP lattice-matched to InP substrate, tailored to emit in the telecom wavelength range. In one implementation, the gain material included nine $In_{x=0.564}Ga_{1-x}As_{y=0.933}P_{1-y}$ quantum well layers of 10 nm thickness (bandgap wavelength of 1600 nm) and $In_{x=0.737}Ga_{1-x}As_{y=0.569}P_{1-y}$ barrier layers of 20 nm thickness (bandgap wavelength of 1300 nm). An additional top barrier layer of 30 nm makes the total height of the gain 300 nm, which is covered by a protective 10 nm thick InP capping layer. E-beam lithography is employed because the resonators are small, and photolithography is also employed as the array itself is large. Steps of the method of fabrication are also provided in the flowchart 200 of FIG. 10(J).

FIG. 10A shows the material stack without the InP cap layer (step 202). The InP cap is ultimately removed during fabrication. In one implementation, a fabrication technique included spin coating ~100 nm of PMMA and thermally depositing ~30 nm of Chromium (Cr) on top of the bare wafer (step 204). Here, the Cr layer serves as a dry etch hard mask to attain and preserve the critical dimensions of the lasing membrane, while the PMMA layer serves as a sacrificial layer for the final and convenient removal of the Cr (See FIG. 10B). Electron beam lithography was used (step 206) to define the device patterns on a hydrogen silsesquioxane (HSQ) negative tone resist coated wafer (See FIG. 10C). The spin-coating condition of HSQ is adjusted such that a 130 nm thick resist is spun on the wafer. After electron beam exposure and development of HSQ, the exposed HSQ serves as a mask for the subsequent reactive ion etching (RIE) process that defines the Cr hard mask (step 208).

The Cr hard mask provides a particularly important metallic layer on top of the photoresist, and in one implementation is 30 nm in height. With this layer, the relatively large radius for the resonators can be formed, and a minimum threshold as noted above achieved. In more detail, with multiple quantum wells, over etching is problematic, and so resonators are created with radii that are too small. The chromium layer tends to protect the resonator and slow down the etch rate. Because of this, resonators may be fabricated with a larger radius range, and such can cause a singularity that leads to the minimum power threshold. As noted above, such a minimum power threshold is highly desirable as there are many applications in which it is desired to minimize energy consumption, e.g., communications and integrated devices. Besides chromium, other types of metal masks may also be employed.

Figure 11B:
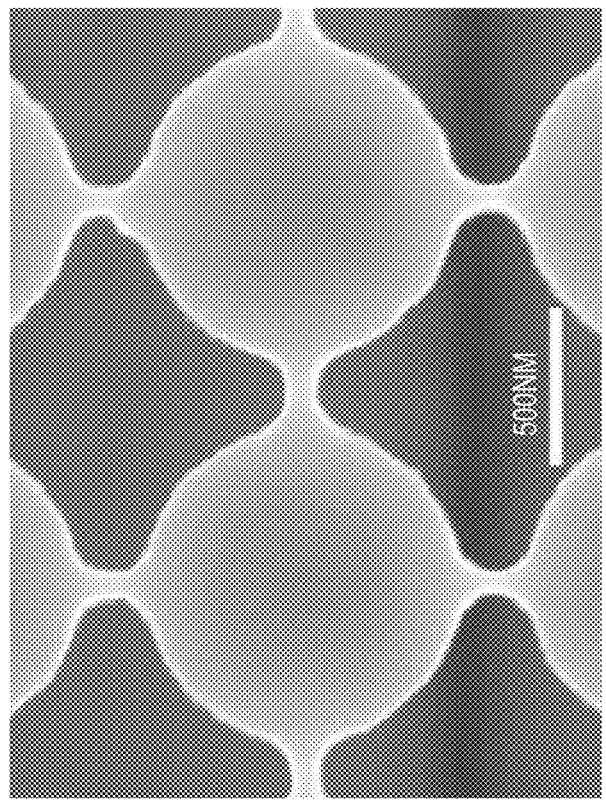
FIGS. 11(A)-11(B) illustrate an electron micrograph image of a membrane structure with cylindrical resonators, along with a close-up view of two cylinders in the center of the array.
Figure 11A:
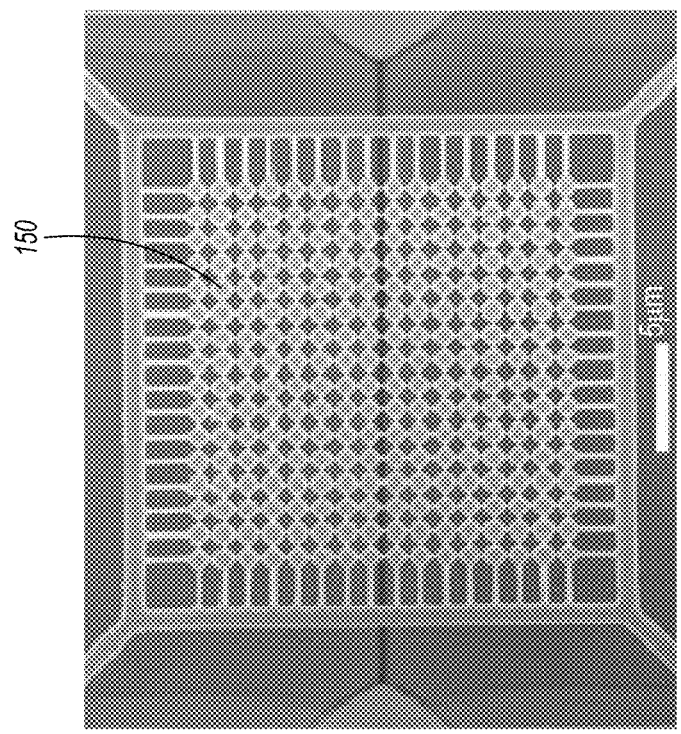

First, the Cr was dry etched using a combination of O2 and Cl2 plasma and subsequently the PMMA layer was dry etched with O2 plasma (See FIG. 10D). Second, the III-V material was dry etched to define the cylindrical nanoresonators with the help of the Cr mask (See FIG. 10D). This RIE, which uses a $H_2:CH_4:Ar$ plasma, primarily etches the InGaAsP material but some InP material as well. Next, and referring to FIG. 10F, organic contaminations and polymer buildup during RIE are removed with a microwave oxygen plasma treatment, and the HSQ mask is removed with buffered oxide etch (step 212). Next, the Cr is removed simply by lifting off the PMMA layer in acetone solvent and slight sonication. Subsequently, a substantial amount of InP substrate material is removed below InGaAsP MQW, with the help of photolithography and HCl solution (step 216). Using photolithography, the areas to be wet-etched are opened in the negative-tone NR9 photoresist (FIG. 10G). Lastly, a diluted solution of hydrochloric acid is used to selectively etch InP while minimally etching InGaAsP (FIG. 10H, step 218). The final structure can be seen in FIG. 10I as a schematic and in FIG. 11 as electron micrograph images. This latter figure shows (FIG. 11(A)) an electron micrograph image of a fully suspended membrane structure 150 with 16×16 cylindrical resonators interconnected by a network of bridges with a visible etch pit in the InP substrate and large openings for easy membrane release and (FIG. 11(B)) a zoomed-in image of two cylinders at the center of the array.

Note that, as a consequence of the resonator radius reduction during RIE and InP selective wet etching processes, radii of the resulting resonators are smaller than the radii after e-beam lithography. This reduction of radii is minimized with the use of the Cr metal mask.

Figure 12:
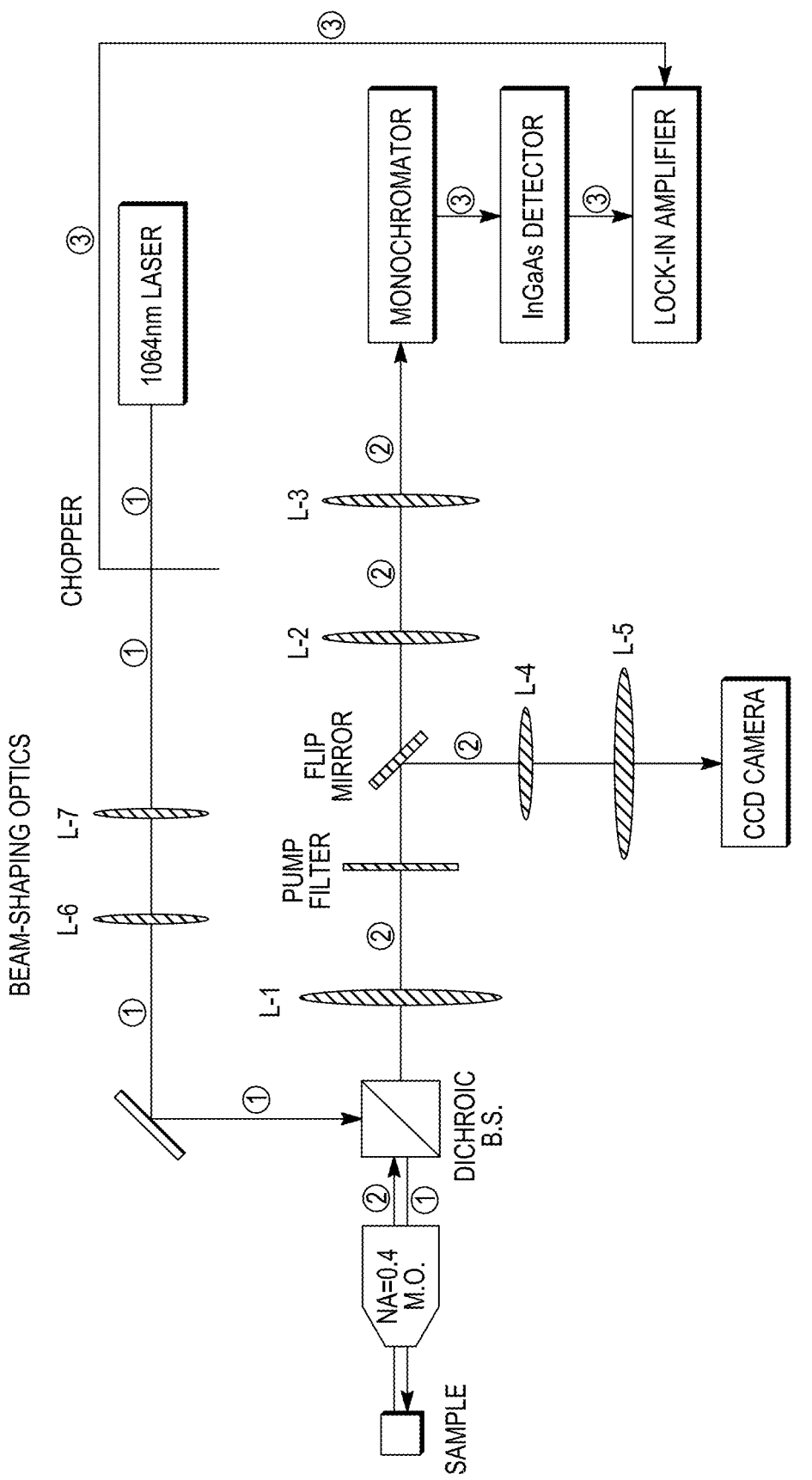
FIG. 12 illustrates a micro-photoluminescence set up used to measure laser emission from BIC lasers.

Referring to FIG. 12, to characterize the BIC lasers, micro-photoluminescence measurements were performed at room temperature. The figure shows a micro-photoluminescence setup used to measure laser emission from BIC lasers. Path 1 represents the pump path; path 2 represents the collection/imaging path; and path 3 represents electrical cables. The microscope objective (M.O.) with L-1,2,3 and L-1,4,5 compose a double 4-f imaging system for the CCD Camera and the monochromator, respectively.

Devices under test were optically pumped by a 1064 nm laser with 12 ns pulse width, at a repetition rate of 300 kHz. A 20× long working distance microscope objective with a numerical aperture (NA) of 0.4 was used to focus the pump beam to a spot size of ~8 µm FWHM in diameter and simultaneously collect the emission from the sample. To minimize chromatic aberration, a telescope is introduced (lenses L-6 and L-7) to adjust the divergence of the pump beam such that the focal planes of the pump and emission wavelengths coincided. Using a double 4-f imaging system in conjunction with a pump filter, laser structures were either imaged onto an IR CCD camera (Indigo Alpha NIR), or spectroscopically measured with a monochromator (CVI Digikrom DK480) in conjunction with a cooled InGaAs detector in lock-in detection configuration. The monochromator can resolve a linewidth of ~0.33 nm.

The IR CCD images of a suspended laser array in operation and its corresponding far-field emission can be seen in FIG. 13 and FIG. 14. FIG. 13 shows: (A) an IR CCD image of a suspended laser array; (B) an image of the array with an overlapping pump beam, and (C) an image of omission from the laser array collected over the camera bandwidth. FIG. 14 shows the far field emission of a laser array over multiple pump powers with the dotted outline indicating the physical size and location of the array. Emission profiles of lasers operating above threshold with increasing pump power: (A) 82 Mw; (B) 98 µW; (C) 111 Mw; and (D) 135 µW. Here, a bandpass filter with a FWHM of 40 nm was utilized so as to only collect emission around the lasing wavelength and to avoid camera saturation.

As may be seen, the pump beam neatly overlaps the laser array and the resulting emission collected over the camera bandwidth is presented in FIG. 13B and FIG. 13C. Far-field emission of the laser array operating above threshold is filtered around the lasing wavelength using a bandpass filter (FWHM of 40 nm) as seen in FIG. 14. The emission profile is more prominent as the pump power is increased. The non-uniform pattern is partly a consequence of back reflections from the etched substrate below the laser array (i.e V-groove etch pit as seen in FIG. 10I).

What has been described is a bound state in the continuum (BIC) laser from a cavity that can surprisingly have arbitrarily high quality factors despite being embedded in the continuum of radiation modes. Cavities according to present principles, made of an array of suspended cylindrical nanoresonators, show persistent single mode lasing for various radii and array sizes. The lasing wavelength follows the theoretical prediction of the BIC mode. These results demonstrate the robustness and scalability of the system. The ability to confine light within the radiation continuum opens the door to the study of the intriguing topological physics of BICs and the realization of non-standard photonic devices, sensors, and sources. Tens of such new BICSEL lasers have been fabricated and it has been demonstrated that the threshold of the lasers is a minimum at the BIC singularity. The demonstrated BIC lasers are thus scalable and ultra efficient coherent light sources. Despite being extremely small, e.g., even down to 8×8 arrays, the system can still efficiently lase. The energy requirement is a minimum at the BIC singularity. Real space images of the lasers have been characterized, showing clean emission from the array.

Implementations may also be provided for more manipulable types of vertical cavity surface emitting lasers or VCSELs, which are based on edge modes of photonic or crystalline Bragg gratings. Prior VCSELs always emitted at normal incidence; however, using systems and methods according to present principles, the emission direction may be altered, i.e., beam steering can be performed, by just changing the thickness of the quantum well.

The above description illustrates various exemplary implementations and embodiments of the systems and methods according to present principles. The invention is not limited to such examples. The scope of the invention is to be limited only by the claims appended hereto, and equivalents thereof.

The invention claimed is:

1. A single-mode bound state in the continuum laser, comprising: a pump source of light, the pump source of light configured to direct light into a resonant cavity, the resonant cavity configured to enable a bound state in the continuum, wherein the single-mode bound state in the continuum is configured to enable resonantly trapped symmetry-compatible modes that destructively interfere, wherein the resonant cavity is made from a material that also serves as an active gain medium of the single-mode bound state in the continuum laser.

2. The laser of claim 1, wherein the cavity is made of an array of cylindrical nanoresonators suspended in air.

3. The laser of claim 2, wherein the array is housed in a membrane of semiconductor material.

4. The laser of claim 1, wherein the cavity is made of a periodic array of nanoresonators interconnected by a network of supporting bridges.

5. The laser of claim 2, wherein the laser is tuned by adjusting the radius of the cylindrical nanoresonators.

6. The laser of claim 5, wherein a radius of each nanoresonator is fabricated to be between 500 nm and 550 nm.

7. The laser of claim 6, wherein the radius of each nanoresonator is fabricated to be between 510 nm and 540 nm.

8. The laser of claim 7, wherein a threshold power of the laser is configured to be less than about 80 µW.

9. The laser of claim 2, wherein the nanoresonators are constructed by electron beam lithography and reactive ion etching followed by a wet etching step.

10. The laser of claim 2, wherein the laser is configured to be a vertical cavity surface emitting laser.

11. The laser of claim 10, wherein the nanoresonators form multiple quantum wells, and wherein an angle of emission is based on the thickness of the multiple quantum wells.

12. A method of making a single-mode bound state in the continuum laser, comprising:
   a. providing a substrate;
   b. fabricating a device layer on the substrate, the device layer to be formed into multiple quantum wells; and
   c. fabricating a top barrier layer on the device layer,
wherein at least the device layer comprises a laser cavity, the laser cavity configured to enable a single-mode bound state in the continuum, wherein the bound state in the continuum is configured to enable resonantly trapped symmetry-compatible modes that destructively interfere, wherein the laser cavity is made from a material that also serves as an active gain medium of the single-mode bound state in the continuum laser.

13. The method of claim 12, wherein the top barrier layer is formed of chromium.

14. The method of claim 13, wherein the chromium layer has a thickness of between 20 nm and 40 nm.

15. The method of claim 12, wherein the substrate is made of InP.

16. The method of claim 12, further comprising disposing a resist layer on top of the top barrier layer, and performing an etching step to create devices.

17. The method of claim 16, further comprising removing the top barrier layer.

18. The method of claim 17, further comprising removing a portion of the InP substrate to suspend the devices.

19. The method of claim 18, wherein the devices are nano resonators.

20. The method of claim 19, wherein the nanoresonators form cylindrical nanoresonators.

21. The method of claim 20, wherein the cylindrical nano resonators are formed into an array, and wherein the cylindrical nanoresonators are connected by bridges. by bridges.

* * * * *